(12) United States Patent
Kim et al.

(10) Patent No.: US 10,741,430 B2
(45) Date of Patent: Aug. 11, 2020

(54) STACK BOAT TOOL AND METHOD USING THE SAME

(71) Applicant: Samsung Electronics Co., Ltd., Suwon-si (KR)

(72) Inventors: Tea-geon Kim, Asan-si (KR); Jung-lae Jung, Asan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 200 days.

(21) Appl. No.: 15/902,209

(22) Filed: Feb. 22, 2018

(65) Prior Publication Data
US 2019/0074202 A1 Mar. 7, 2019

(30) Foreign Application Priority Data
Sep. 7, 2017 (KR) .................. 10-2017-0114691

(51) Int. Cl.
*H01L 21/67* (2006.01)
*H01L 21/673* (2006.01)
(Continued)

(52) U.S. Cl.
CPC .. *H01L 21/67333* (2013.01); *H01L 21/67121* (2013.01); *H01L 24/75* (2013.01); *H01L 24/81* (2013.01); *H01L 24/95* (2013.01); *H01L 25/50* (2013.01); *H01L 25/105* (2013.01); *H01L 2224/16145* (2013.01); *H01L 2225/06513* (2013.01); *H01L 2225/1023* (2013.01); *H01L 2225/1058* (2013.01); *H01L 2924/00014* (2013.01); *H01L 2924/1431* (2013.01); *H01L 2924/1434* (2013.01); *H01L 2924/1436* (2013.01); *H01L 2924/1437* (2013.01); *H01L 2924/15311* (2013.01); *H01L 2924/15331* (2013.01); *H01L 2924/3511* (2013.01)

(58) Field of Classification Search
CPC ..... H01L 21/67333; H01L 2221/68313; H01L 2221/68309; H01L 21/67313; H01L 21/67346; H05K 7/023
See application file for complete search history.

(56) References Cited

U.S. PATENT DOCUMENTS 5,606,793 A 3/1997 Gross et al.
6,750,551 B1 * 6/2004 Frutschy ................. F16L 41/08
257/785

(Continued)

FOREIGN PATENT DOCUMENTS

KR 10-2001-0054003 7/2001
KR 10-2004-0031493 4/2004
(Continued)

*Primary Examiner* — Gregory A Wilson
(74) *Attorney, Agent, or Firm* — Muir Patent Law, PLLC

(57) ABSTRACT

A stack boat tool includes a boat including a stack hole configured to accommodate first and second semiconductor packages; and a weight bar configured to be placed on the second semiconductor package during a reflow process for combining the first and second semiconductor packages, wherein the weight bar includes: a base configured to contact an upper surface of the second semiconductor package; a sidewall on the base; and a balance weight arranged on the base configured to lower a weight center of the weight bar.

19 Claims, 11 Drawing Sheets

(51) Int. Cl.
*H01L 23/00* (2006.01)
*H01L 25/00* (2006.01)
*H01L 25/10* (2006.01)

(56) References Cited

U.S. PATENT DOCUMENTS

| | | | | |
|---|---|---|---|---|
| 8,508,954 | B2* | 8/2013 | Kwon | H01L 24/97 |
| | | | | 361/790 |
| 8,603,860 | B2* | 12/2013 | Chen | H01L 24/75 |
| | | | | 257/E21.499 |
| 8,889,486 | B2* | 11/2014 | Chen | H01L 23/3128 |
| | | | | 438/107 |
| 9,015,930 | B2* | 4/2015 | Maeda | H01L 21/67092 |
| | | | | 29/744 |
| 9,171,827 | B2* | 10/2015 | Lee | H01L 25/105 |
| 9,343,386 | B2 | 5/2016 | Huang et al. | |
| 9,355,931 | B2* | 5/2016 | Kim | H01L 23/36 |
| 9,881,822 | B2* | 1/2018 | Kim | H01L 21/67333 |
| 2003/0231469 | A1* | 12/2003 | Ono | H01L 21/67333 |
| | | | | 361/715 |
| 2007/0215517 | A1* | 9/2007 | Holler | H01L 21/67333 |
| | | | | 206/725 |
| 2012/0280404 | A1 | 11/2012 | Kwon et al. | |
| 2013/0102112 | A1 | 4/2013 | Chen et al. | |
| 2014/0239488 | A1* | 8/2014 | Kobayashi | H01L 23/36 |
| | | | | 257/718 |
| 2016/0086834 | A1 | 3/2016 | Kim et al. | |

FOREIGN PATENT DOCUMENTS

| | | |
|---|---|---|
| KR | 10-1042912 | 6/2011 |
| KR | 10-1416292 | 7/2014 |
| KR | 10-2016-0081289 | 7/2016 |

* cited by examiner

STACK BOAT TOOL AND METHOD USING THE SAME

CROSS-REFERENCE TO RELATED APPLICATION

This application claims the benefit of under 35 U.S.C § 119 to Korean Patent Application No. 10-2017-0114691, filed on Sep. 7, 2017, in the Korean Intellectual Property Office, the disclosure of which is incorporated herein in its entirety by reference.

BACKGROUND

The present disclosure relates to a stack boat tool and a method using the same, and more particularly, to a stack boat tool for a reflow process.

In order to realize miniaturization and various performances of semiconductor products, a package-on-package, in which an upper semiconductor package is stacked on a lower semiconductor package, has been proposed. In order to manufacture a package-on-package, a reflow process for connecting a lower semiconductor package and an upper semiconductor is generally performed. Due to minuteness and high integration of semiconductor products, warpage may occur on a lower semiconductor package and/or an upper semiconductor package in the reflow process. Due to the warpage of the semiconductor packages, a non-wet defect (also referred to as lifted ball, hanging ball, ball on pad or ball on land defect) and a short defect may occur.

SUMMARY

The present disclosure provides a stack boat tool configured to prevent a non-wet defect and a short defect during performing a reflow process for combining a lower semiconductor package and an upper semiconductor package.

According to an aspect of the inventive concept, there is provided a stack boat tool including: a boat including a stack hole configured to accommodate a first semiconductor package and a second semiconductor package on the first semiconductor package; and a weight bar configured to be provided on the second semiconductor package during a reflow process for combining the first and second semiconductor packages, wherein the weight bar includes: a base configured to contact an upper surface of the second semiconductor package; sidewall on the base; and a balance weight on the base configured to lower a weight center of the weight bar.

According to another aspect of the inventive concept, there is provided a stack boat tool including: a lower boat including a stack hole that accommodates a first semiconductor package and a second semiconductor package on the first semiconductor package; an upper boat configured to be removably coupled to the lower boat, wherein the upper boat comprising a through hole configured to be vertically arranged with the stack hole; and a weight bar configured to be provided on the second semiconductor package, wherein the weight bar is configured to be accommodated in the through hole, wherein the weight bar includes: a base facing an upper surface of the second semiconductor package; sidewall that is on the base and defines an inner space together with the base; and a ceiling portion that is on the sidewall and covers the inner space.

According to another aspect of the inventive concept, there is provided a stack boat tool including: a lower boat including at least one stack hole configured to accommodate a stack structure including first and second semiconductor packages vertically stacked thereon; an upper boat that comprises at least one through hole and is removably attached to the lower boat in a manner such that the at least one through hole is aligned with the at least one stack hole; and a weight bar configured to be accommodated in the at least one through hole to be able to float in the at least one through hole and is configured to apply a weight to the stack structure.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to accompanying drawings.

Figure 1A:
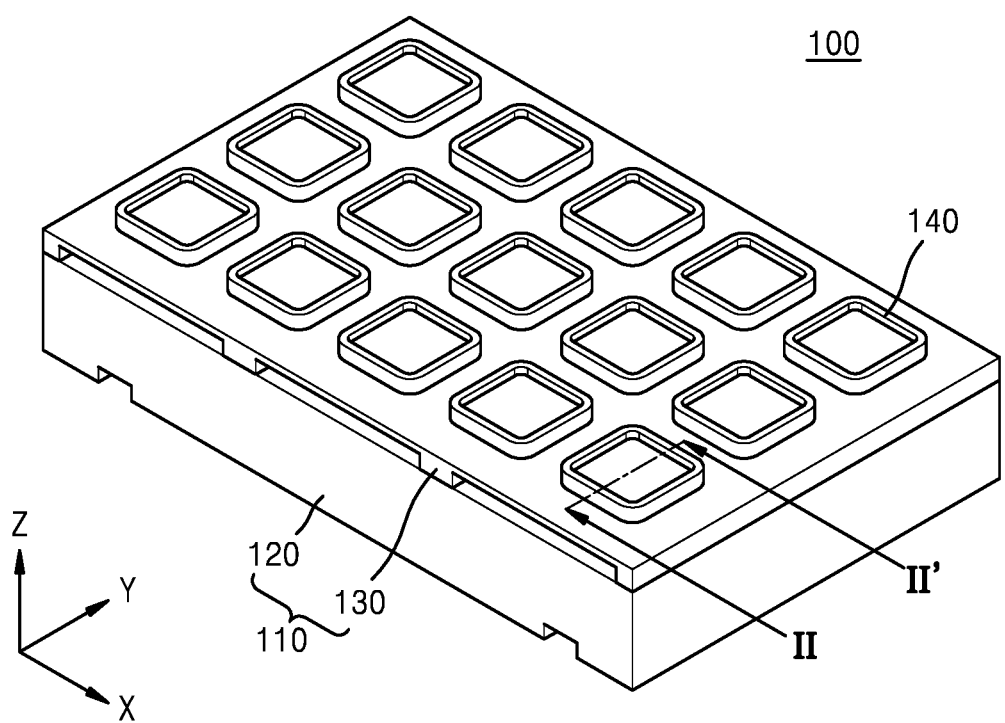
FIG. 1A is a perspective view of a stack boat tool according to an exemplary embodiment of the inventive concept.
Figure 1B:
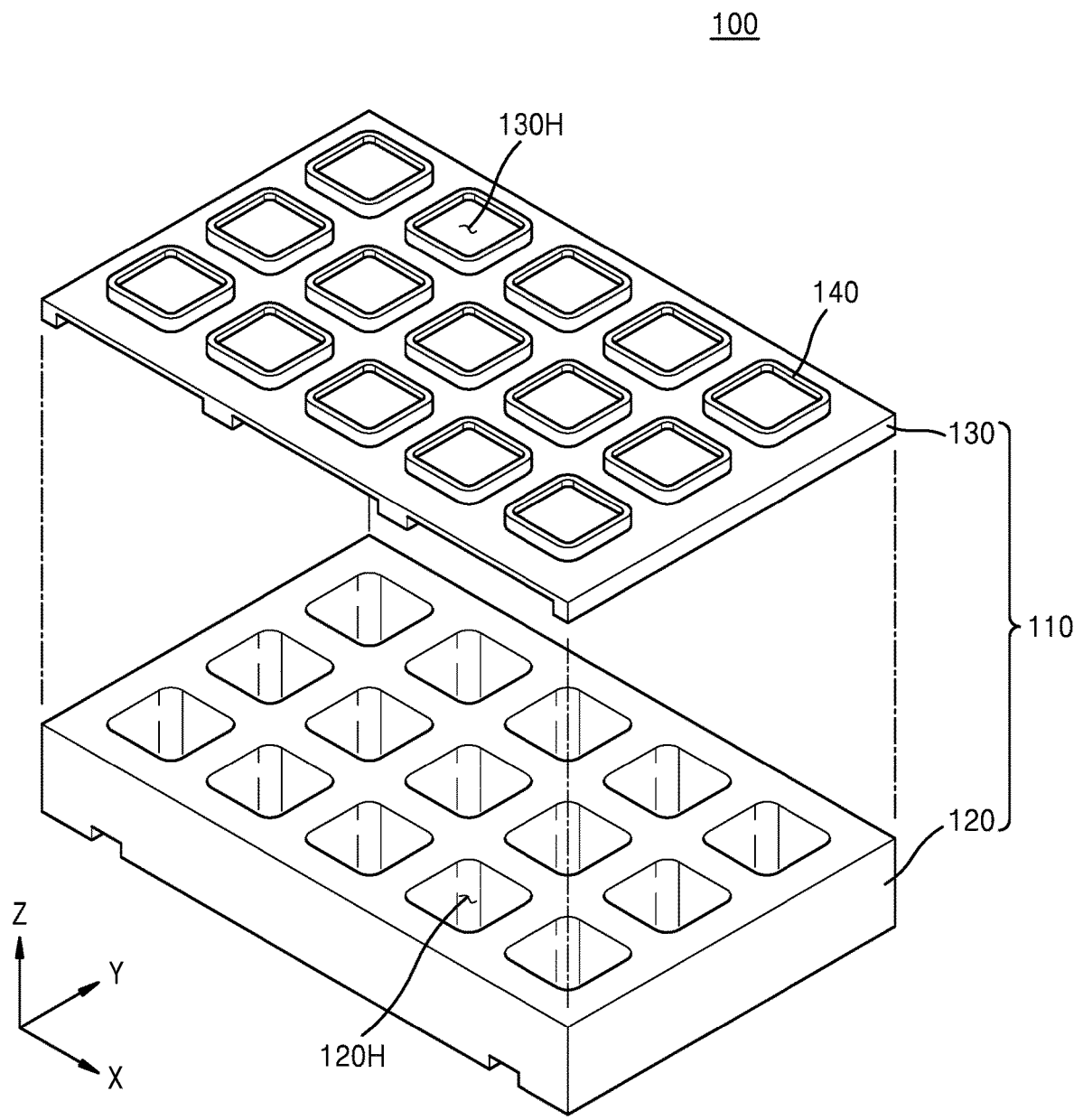
FIG. 1B is an exploded perspective view of the stack boat tool of FIG. 1A.
Figure 2:
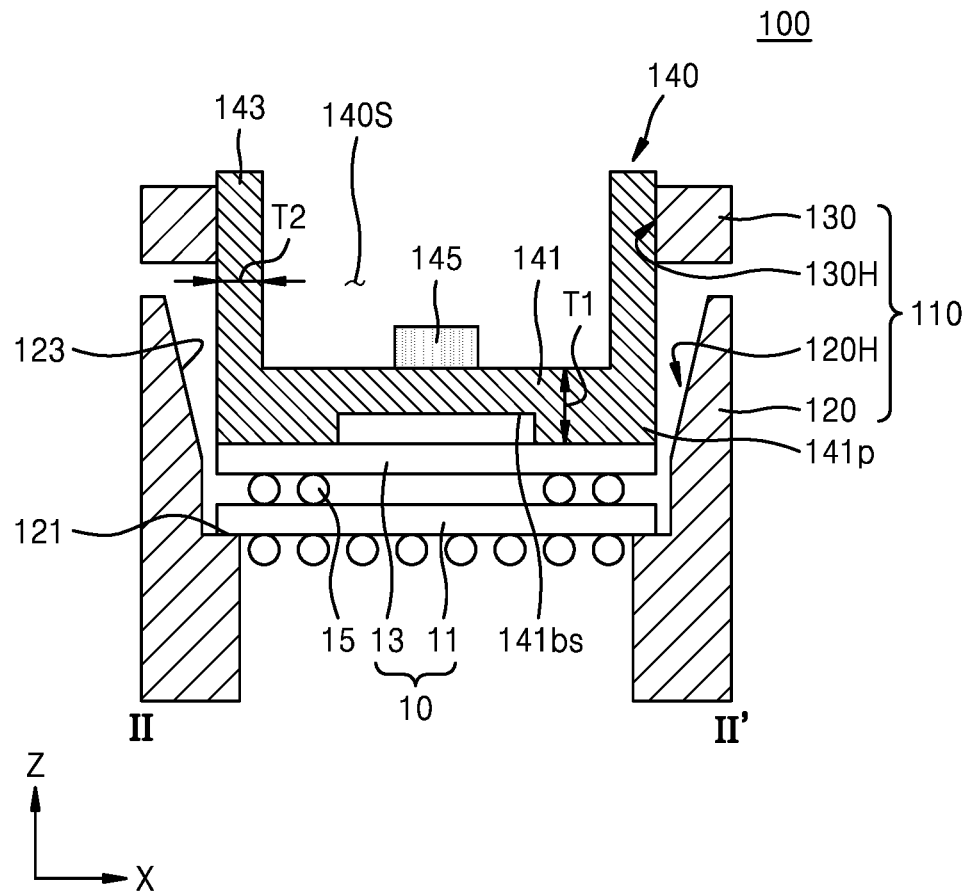
FIG. 2 is a cross-sectional view taken along line II-II' of FIG. 1A.

FIG. 1A is a perspective view of a stack boat tool 100 according to some exemplary embodiments of the inventive concept. FIG. 1B is an exploded perspective view of the stack boat tool 100 of FIG. 1A. FIG. 2 is a cross-sectional view taken along line II-II' of FIG. 1A.

Referring to FIGS. 1A through 2, the stack boat tool 100 may be a semiconductor manufacturing tool that may accommodate a plurality of stack structures 10 each including a lower semiconductor package 11 and an upper semiconductor package 13 during a reflow process for connecting the upper semiconductor package 13 and the lower semiconductor package 11. For example, the stack boat tool 100 may be used for performing a semiconductor manufacturing process for electrically connecting or mechanically connecting the lower semiconductor package 11 with the upper semiconductor package 13 in each stack structure 10. For example, the stack boat tool 100 may be provided for performing a reflow process for connecting the upper semiconductor package 13 and the lower semiconductor package 11 by melting or hardening connection members 15 (e.g., bumps or solder balls) on a lower surface of the upper semiconductor package 13.

According to exemplary embodiments, during a reflow process, a plurality of stack structures 10 may be transported between a plurality of process chambers, for example, heating chambers and cooling chambers by being mounted on the stack boat tool 100. While the plurality of stack structures 10 are being transported, the stack boat tool 100 may support the plurality of stack structures 10 to prevent the plurality of stack structures 10 from thermal deformation. For example, in order to melt the connection members 15 arranged on a lower surface of the upper semiconductor package 13, the stack boat tool 100, on which the plurality of stack structures 10 are mounted, may be placed in a heating chamber and a high temperature gas may be introduced into the heating chamber. According to exemplary embodiments, the stack boat tool 100 applies a predetermined weight to the lower semiconductor package 11 and/or the upper semiconductor package 13 during the reflow process, and thus, warpage of the lower semiconductor package 11 and/or the upper semiconductor package 13 may be prevented in a high temperature atmosphere in the heating chamber.

In some embodiments, the lower semiconductor package 11 and the upper semiconductor package 13 may be the same type of semiconductor packages. Also, the lower semiconductor package 11 and the upper semiconductor package 13 may be semiconductor packages different in types from each other.

In some embodiments, the lower semiconductor package 11 may be a semiconductor package including a processor unit. For example, the lower semiconductor package 11 may include a microprocessor unit (MPU) or a graphics processing unit (GPU). In some embodiments, the lower semiconductor package 11 may include an interposer.

The upper semiconductor package 13 may be a semiconductor package including a semiconductor memory device. For example, the upper semiconductor package 13 may include a high bandwidth memory (HBM). In some embodiments, the upper semiconductor package 13 may include a non-volatile memory. The non-volatile memory may include phase-change random access memory (PRAM), magneto-resistive random access memory (MRAM), ferroelectric random access memory (FRAM), or resistive random access memory (RRAM), but is not limited thereto. In some embodiments, the upper semiconductor package 13 may include a volatile memory, such as DRAM or SRAM. In some embodiments, the upper semiconductor package 13 may include a logic chip and at least two semiconductor memory chips stacked on the logic chip.

In FIG. 2, it is depicted that two vertically stacked semiconductor packages are accommodated in the stack boat tool 100, but the disclosure is not limited thereto. In some embodiments, more than three vertically stacked semiconductor packages may be accommodated in the stack boat tool 100.

The stack boat tool 100 may include a boat 110 and a weight bar 140. The boat 110 may be a multi-stepped assembly including a lower boat 120 and an upper boat 130 that are coupled to and separable from each other. For example, the upper boat 130 is removably attached/coupled to the lower boat 120. The term "boat" as used herein may refer to a physical structure that may include two opposing side walls and a bottom flat surface.

The lower boat 120 may have a stack hole 120H to accommodate the stack structure 10. In order to place the stack structure 10 in the stack hole 120H, the upper boat 130 and the lower boat 120 are separated from each other. According to exemplary embodiments, the size of the lower semiconductor package 11 in a horizontal direction (x-direction) may be the same as the size of the upper semiconductor package 13 in the horizontal direction, but the disclosure is not limited thereto. The lower semiconductor package 11 and the upper semiconductor package 13 may be aligned in a vertical direction by being sequentially stacked in the stack hole 120H.

The lower boat 120 may include a supporting surface 121 and an inclined surface 123 that are formed on an inner surface thereof and provided by the stack hole 120H.

The supporting surface 121 is a surface of the lower boat 120 on which the stack structure 10 accommodated in the stack hole 120H are seated, and may support the stack structure 10 placed thereon. The supporting surface 121 may be parallel to a lower surface of the lower semiconductor package 11 and may support the lower semiconductor package 11 by contacting opposing edge portions of a lower surface of the lower semiconductor package 11.

The inclined surface 123 may guide the lower semiconductor package 11 and the upper semiconductor package 13 so that the lower semiconductor package 11 and the upper semiconductor package 13 are disposed in a horizontal state in the stack hole 120H. For example, after the lower semiconductor package 11 and/or the upper semiconductor package 13 are transported to an upper side of the stack hole 120H and are lowered from the upper side of the stack hole 120H, the lower semiconductor package 11 and/or the upper semiconductor package 13 may be positioned on a predetermined location by sliding along the inclined surface 123. The lower semiconductor package 11 may be placed in a horizontal state on the supporting surface 121 by being guided by the inclined surface 123, and the upper semiconductor package 13 may be placed in a horizontal state on the lower semiconductor package 11 by being guided by the inclined surface 123.

The inclined surface 123 may be inclined by a predetermined angle with respect to the vertical direction (for example, a z-direction) of the supporting surface 121. The inclined surface 123 may extend upwards from a position that is spaced apart from the supporting surface 121 in a vertical direction. Due to the inclined surface 123, a horizontal area of the stack hole 120H may be gradually reduced from an inlet of the stack hole 120H through which the lower semiconductor package 11 and/or the upper semiconductor package 13 enter towards the lower side of the stack hole 120H.

The upper boat 130 may include a through hole 130H configured to accommodate the weight bar 140. The upper boat 130 may be arranged on the lower boat 120, and may be coupled to the lower boat 120 so that the through hole 130H is vertically aligned with the stack hole 120H of the lower boat 120.

The weight bar 140 is accommodated in the through hole 130H of the upper boat 130. The weight bar 140 is a structure having a sufficient weight configured to apply pressure to the stack structure 10 by being placed on the stack structure 10 placed in the stack hole 120H of the lower boat 120. For example, the weight bar 140 may apply a weight corresponding to the weight thereof to the stack structure 10 while a reflow process is being performed. Due to the weight applied by the weight bar 140, the lower semiconductor package 11 and/or the upper semiconductor package 13 may be stably connected to each other by the connection members 15. Also, due to the weight applied by the weight bar 140, warpage of the lower semiconductor package 11 and/or the upper semiconductor package 13 may be prevented while a reflow process is being performed. Accordingly, the cause of a non-wet defect and a short defect due to the warpage of the lower semiconductor package 11 and/or the upper semiconductor package 13 may be prevented.

The weight bar 140 may be accommodated in the through hole 130H of the upper boat 130 to be able to float. For example, the weight bar 140 may be accommodated in the through hole 130H of the upper boat 130 to be able to move within a predetermined range in a vertical direction and/or a horizontal direction. Also, the weight bar 140 may be accommodated in the through hole 130H to be able to rotate within a predetermined angle with the vertical direction as a rotation axis. When a pressure device fixedly combined on the upper boat 130 is used, an excess weight may be applied according to a thickness or arranged state of the stack structure 10, and, as a result of the excess weight to the stack structure 10, the connection members 15 may be damaged. However, according to the present embodiment, the weight bar 140 is floatably accommodated in the through hole 130H, and thus, a constant weight, that is, a weight corresponding to the weight of the weight bar 140, is applied to the stack structure 10 during a reflow process regardless of the thickness or the arranged state of the stack structure 10.

Figure 3:
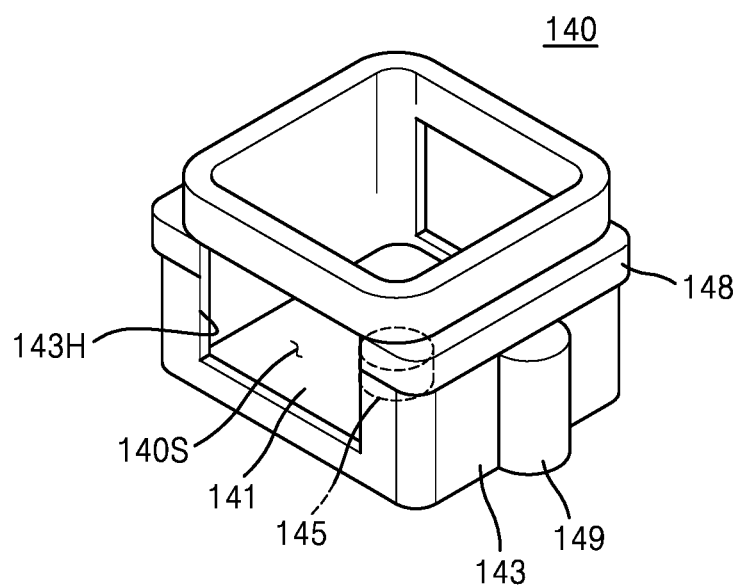
FIG. 3 is a perspective view of a weight bar according to some embodiments of the inventive concept.

FIG. 3 is a perspective view of the weight bar 140 according to an exemplary embodiment of the inventive concept.

Referring to FIGS. 2 and 3, the weight bar 140 may include a base 141, a sidewall 143, and a balance weight 145. The balance weight 145 is a structure having a sufficient weight configured to balance the weight bar 140 so that the weight bar 140 may apply a uniform weight corresponding to the weight thereof to the stack structure 10 while a reflow process is being performed.

The base 141 is a bottom part of the weight bar 140, and may contact an upper surface of the upper semiconductor package 13 when the weight bar 140 is accommodated in the through hole 130H of the upper boat 130.

In some embodiments, only a portion of a bottom surface 141bs of the base 141 facing the upper surface of the upper semiconductor package 13 may contact the upper surface of the upper semiconductor package 13. For example, the base 141 may include a protrusion part 141p on the bottom surface 141bs facing the upper surface of the upper semiconductor package 13.

A location of protrusion part 141p may correspond to a location of the connection members 15 on a lower surface of the upper semiconductor package 13. In some embodiments, the protrusion part 141p may be provided on an edge portion of the bottom surface 141bs. For example, the protrusion part 141p of the base 141 may extend along an edge of the bottom surface 141bs. Since the bottom surface 141bs of the base 141 includes the protrusion part 141p, higher pressure may be partly applied to the location where the connection members 15 are located, and thus, the connection members 15 may further be strongly compressed. In this exemplary embodiment, a thickness T1 of the protrusion part 141p in a vertical direction (z-direction) is larger than a thickness T2 of the sidewall of the weight bar 140 in a horizontal direction (x-direction).

The sidewall 143 may be arranged on the base 141. For example, the sidewall 143 may be arranged on an edge portion of an upper surface of the base 141, and may define a predetermined inner space 140S together with the base 141. The sidewall 143 may contact an inner surface of the upper boat 130 provided by the through hole 130H.

In some embodiments, the weight bar 140 may include a stop bumper 148 provided to define a moving range of the weight bar 140 in a vertical direction and to prevent a derailing of the weight bar 140. The stop bumper 148 will be described in detail below.

In some embodiments, the weight bar 140 may include a guide protrusion 149 on the sidewall 143 to guide the movement of the weight bar 140 in a vertical direction. The guide protrusion 149 will be described in detail below.

In some embodiments, at least one hole 143H that connects the inner space 140S and the outside of the weight bar 140 may be formed on the sidewall 143. The at least one hole 143H on the sidewall 143 may be a pathway through which a high temperature gas flowing in the heating chamber may pass. For example, a heated gas introduced in the inner space 140S of the weight bar 140 may be discharged through the at least one hole 143H formed on the sidewall 143.

A high temperature gas may be readily discharged to the outside of the stack boat tool 100 from the inner space 140S through the at least one hole 143H formed on the sidewall 143, and thus, vibration or shaking of the weight bar 140 due to a gas flow in the inner space 140S of the weight bar 140 may be reduced. Also, since the at least one hole 143H is formed on the sidewall 143, a contact area between the high temperature gas and the weight bar 140 is reduced. Thus, vibration or shaking of the weight bar 140 due to a gas flow towards sides of the weight bar 140 may be reduced. Since the shaking of the weight bar 140 due to the gas flow is reduced, an excessive variation of weight applied to the stack structure 10 by the weight bar 140 due to the vibration or shaking of the weight bar 140 may be prevented.

In some embodiments, the sidewall 143 may comprise two surfaces which are opposite to each other, and the at least one hole 143H may be respectively formed on the two surfaces of the sidewall 143.

The balance weight 145 may lower a weight center of the weight bar 140 so that the weight center of the weight bar 140 is closer to the stack structure 10 accommodated in the stack hole 120H of the lower boat 120. The balance weight 145 may provide a restoration force that restores the weight bar 140 inclined by an external force to a horizontal state. That is, since the weight center of the weight bar 140 is lowered by the balance weight 145, vibration or shaking of the weight bar 140 during a reflow process may be mitigated. Also, since the weight bar 140 has a restoration force by the balance weight 145, the weight bar 140 may maintain a horizontal state. Thus, the weight bar 140 may apply a uniform weight to the stack structure 10, and an excessive variation of a weight applied to the stack structure 10 may be prevented. The balance weight 145 may be referred to as a weight.

The balance weight 145 may be arranged on an upper surface of the base 141. In some embodiments, the balance weight 145 may be arranged on a center of the upper surface of the base 141.

In some embodiments, the balance weight 145 may have a weight in a range from about 10% to about 30% of a total weight of the weight bar 140, but the weight of the balance weight 145 is not limited thereto.

In some embodiments, the balance weight 145 may include a material having a specific weight greater than other parts of the weight bar 140.

The weight bar 140 may include a material having a relatively higher hardness to avoid damage due to contact with the stack structure 10 and/or the boat 110. For example, the weight bar 140 may include an alloy steel having in a hardness range from about 50 HRC to about 70 HRC (Rockwell hardness).

In some embodiments, the base 141 that contacts the stack structure 10 may include a material having a relatively higher hardness than other parts of the weight bar 140. In some embodiments, the weight bar 140 may include a protection coating layer for preventing damage on a surface of the base 141 that contacts the stack structure 10.

Since the weight bar 140 includes a relatively higher hardness material, damage to the weight bar 140, in particular, to the base 141 that contacts the stack structure 10 may be prevented. Therefore, a placement of the weight bar 140 on the stack structure 10 by tilting of the weight bar 140 caused by wearing of the base 141 may be prevented, and also, a problem of non-uniform weight application onto the stack structure 10 due to the tilting of the weight bar 140 may be improved.

In some embodiments, a uniform weight may be applied to the stack structure 10 in which the lower semiconductor package 11 and the upper semiconductor package 13 are vertically stacked by using the weight bar 140 that is accommodated to be able to float in the through hole 130H of the upper boat 130. Therefore, the occurrence of a non-wet defect or a short defect due to thermal deformation of the lower semiconductor package 11 and the upper semiconductor package 13 may be prevented. Also, the weight bar 140 included in the stack boat tool 100 includes the balance weight 145 for lowering the weight center of the weight bar 140, and thus, vibration or shaking of the weight bar 140 due to the flow of high temperature gas may be mitigated, and an excessive variation of weight applied to the stack structure 10 may be prevented.

Figure 4:
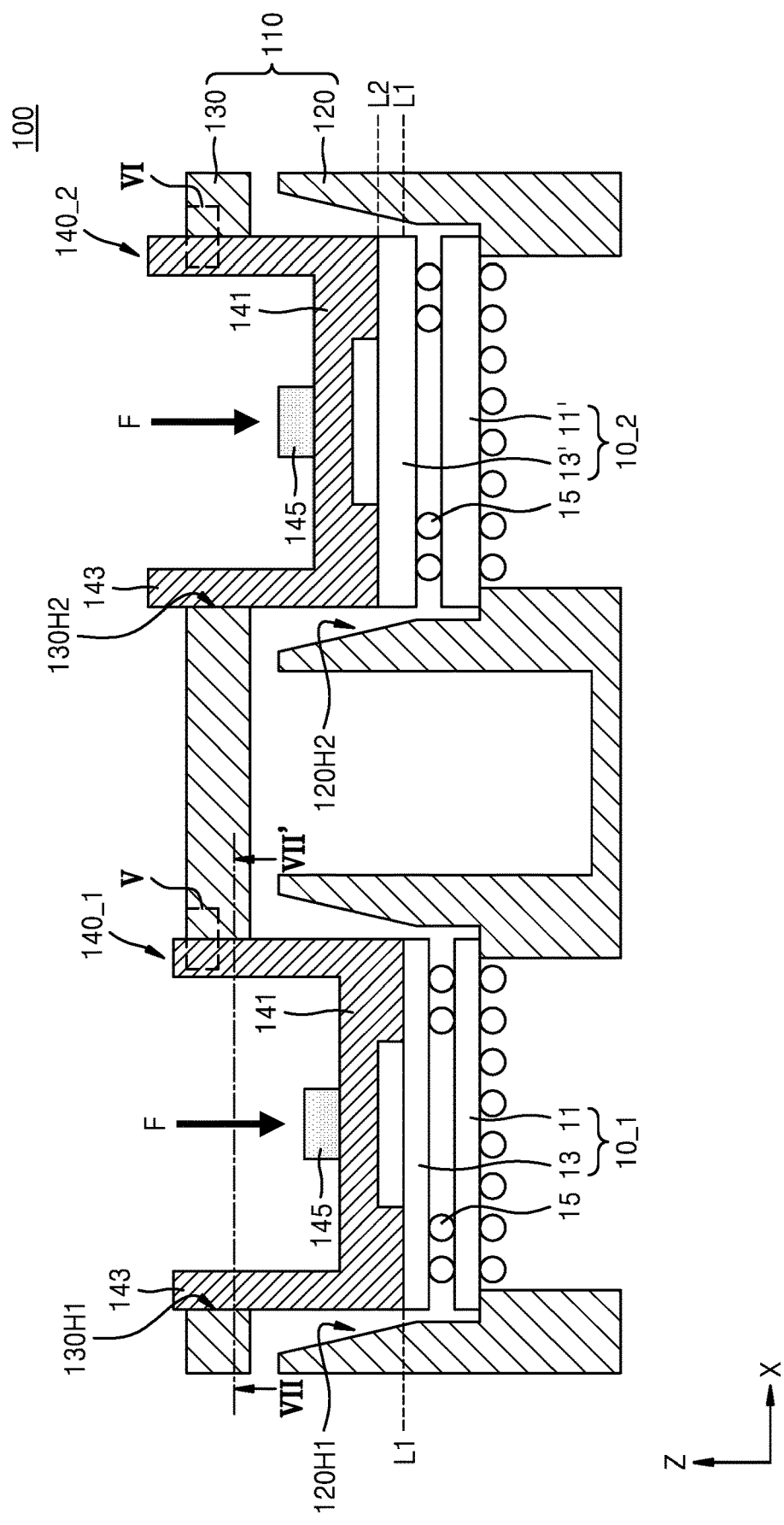
FIG. 4 is a cross-sectional view of a stack boat tool according to some embodiments of the inventive concept.
Figure 5:
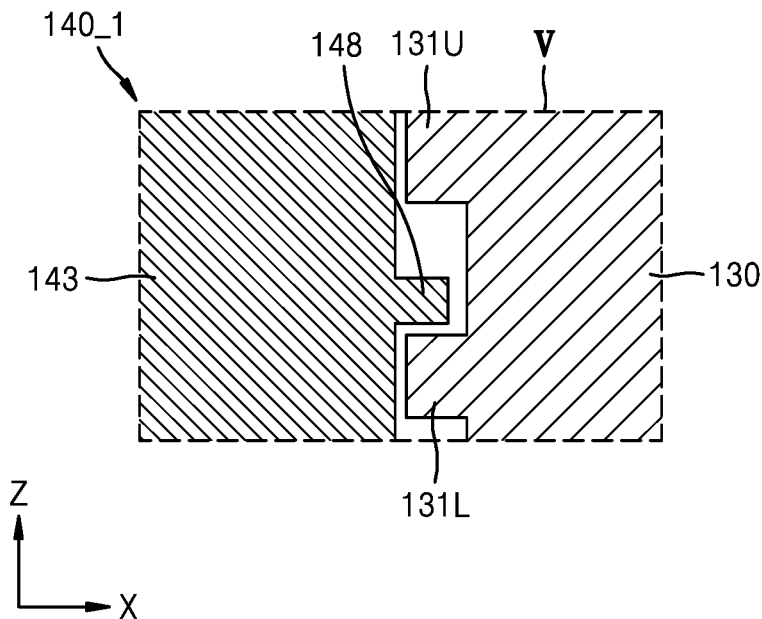
FIGS. 5 and 6 respectively are magnified views of a region V and a region VI of FIG. 4.
Figure 6:
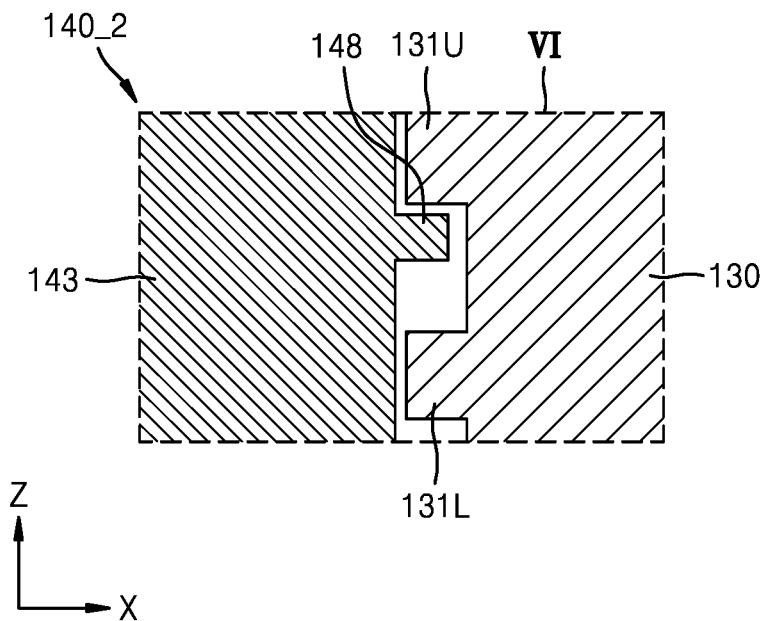
Figure 7:
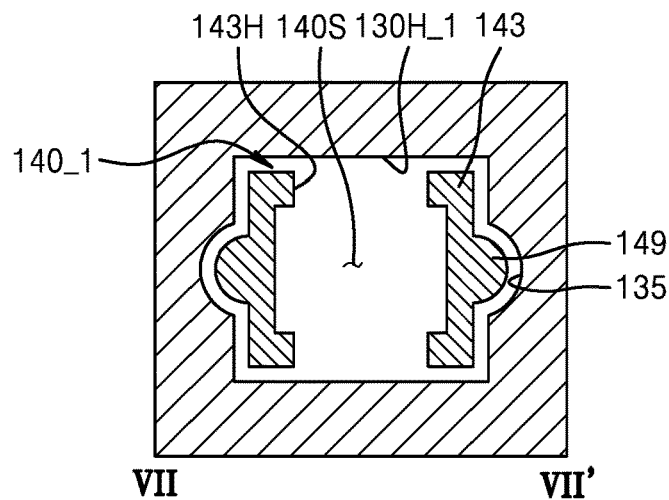
FIG. 7 is a cross-sectional view taken along line VII-VII' of FIG. 4.
Figure 7:
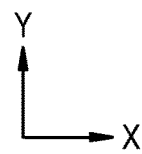

FIG. 4 is a cross-sectional view of the stack boat tool 100 according to some embodiments of the inventive concept. FIGS. 5 and 6 respectively are magnified views of a region V and a region VI of FIG. 4. FIG. 7 is a cross-sectional view taken along line VII-VII' of FIG. 4.

Referring to FIG. 4, the lower boat 120 may include a first stack hole 120H1 and a second stack hole 120H2, and the upper boat 130 may include a first through hole 130H1 and a second through hole 130H2 respectively vertically aligned with the first stack hole 120H1 and the second stack hole 120H2. A first weight bar 140_1 and a second weight bar 140_2 respectively may be accommodated in the first through hole 130H1 and the second through hole 130H2.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

The first stack hole 120H1 and the second stack hole 120H2 may accommodate a first stack structure 10_1 and a second stack structure 10_2, respectively. The first stack structure 10_1 accommodated in the first stack hole 120H1 may have a thickness different from that of the second stack structure 10_2 accommodated in the second stack hole 120H2. For example, a thickness difference between the first stack structure 10_1 and the second stack structure 10_2 may be caused because the first stack structure 10_1 and the second stack structure 10_2 include different types of semiconductor packages, or may be caused by process errors. Due to the thickness difference between the first stack structure 10_1 and the second stack structure 10_2, a level L1 of an upper surface of the first stack structure 10_1 may be different from a level L2 of an upper surface of the second stack structure 10_2 in a vertical direction (z-direction). In this exemplary embodiment, the level L1 is positioned lower than the level L2 in the vertical direction.

In this exemplary embodiment, the first weight bar 140_1 and the second weight bar 140_2 may have the same weight in order to apply the same weight F to the first stack structure 10_1 and the second stack structure 10_2. As described above, since the first weight bar 140_1 and the second weight bar 140_2 are respectively accommodated in the first through hole 130H1 and the second through hole 130H2 to be able to float, even though positions of the first weight bar 140_1 and the second weight bar 140_2 in a vertical direction (for example, z-direction) are different, the weight F being applied to the first stack structure 10_1 and the second stack structure 10_2 may be equal.

Referring to FIGS. 4 through 6, the first and second weight bars 140_1 and 140_2 may be accommodated in the first and second through holes 130H1 and 130H2 of the upper boat 130 to be able to float in a predetermined range in the vertical direction.

In some embodiments, the upper boat 130 may include an upper stopper 131U and a lower stopper 131L that are vertically separated from each other on an inner surface provided by the first and second through holes 130H1 and 130H2. Each of the first and second weight bars 140_1 and 140_2 may include a stop bumper 148 that protrudes from the sidewall 143 in a horizontal direction (x-direction) and is configured to contact the upper stopper 131U and the lower stopper 131L. For example, the upper stopper 131U may prevent the first and second weight bars 140_1 and 140_2 from derailing from the stack boat tool 100 due to an external force applied to the stack boat tool 100.

A floating range of the first and second weight bars 140_1 and 140_2 in a vertical direction may be defined by the upper stopper 131U and the lower stopper 131L. In some embodiments, in order to avoid a case that an excessive weight greater than the weight of the first and second weight bars 140_1 and 140_2 is applied to the first stack structure 10_1 and the second stack structure 10_2 when the stop bumper 148 contacts and is supported by the upper stopper 131U, the floating range of the first and second weight bars 140_1 and 140_2 in the vertical direction may be determined such that the stop bumper 148 does not contact and support the upper stopper 131U during the reflow process. For example, the floating range of the first and second weight bars 140_1 and 140_2 in the vertical direction may be determined to be greater than at least a thickness tolerance of the first stack structure 10_1 and the second stack structure 10_2.

Referring to FIGS. 4 and 7, the first weight bar 140_1 may include guide protrusions 149 for guiding the movement of the first weight bar 140_1 in the vertical direction on the sidewall 143 of the weight bar 140. The upper boat 130 may include guide grooves 135 on an inner surface of the first through hole 130H1 of the upper boat 130. The guide grooves 135 correspond to the guide protrusions 149. The guide protrusions 149 and the guide grooves 135 respectively may extend in the vertical direction.

When the first weight bar 140_1 is accommodated in the first through hole 130H1 of the upper boat 130, the guide protrusions 149 of the first weight bar 140_1 may be accommodated in the guide grooves 135 of the upper boat 130. While the first weight bar 140_1 is moved in the vertical direction, the guide protrusions 149 may move in the guide grooves 135 in contact with the guide grooves 135. Thus, the first weight bar 140_1 may be stably moved in the vertical direction. Also, since the guide protrusions 149 contact the guide grooves 135 and are supported by the guide grooves 135, excessive vibration and shaking of the first weight bar 140_1 in a horizontal direction (for example, an X-direction or a Y-direction) may be prevented.

Figure 8A:
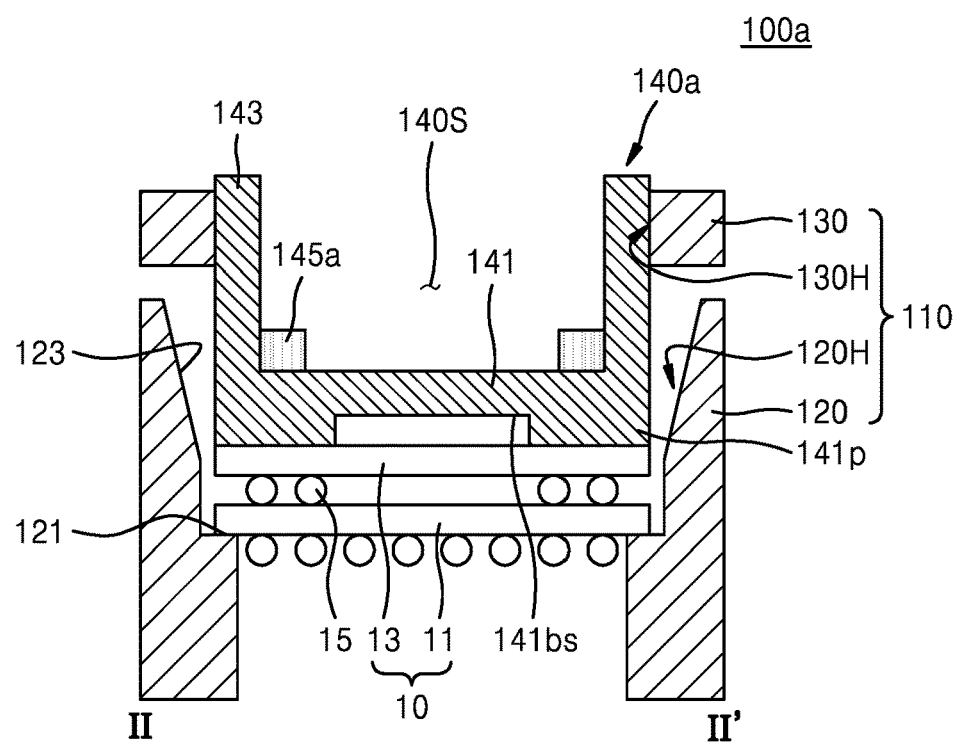
FIGS. 8A and 8B are cross-sectional views for explaining a stack boat tool according to some embodiments of the inventive concept.
Figure 8A:
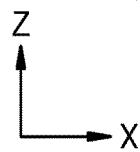
Figure 8B:
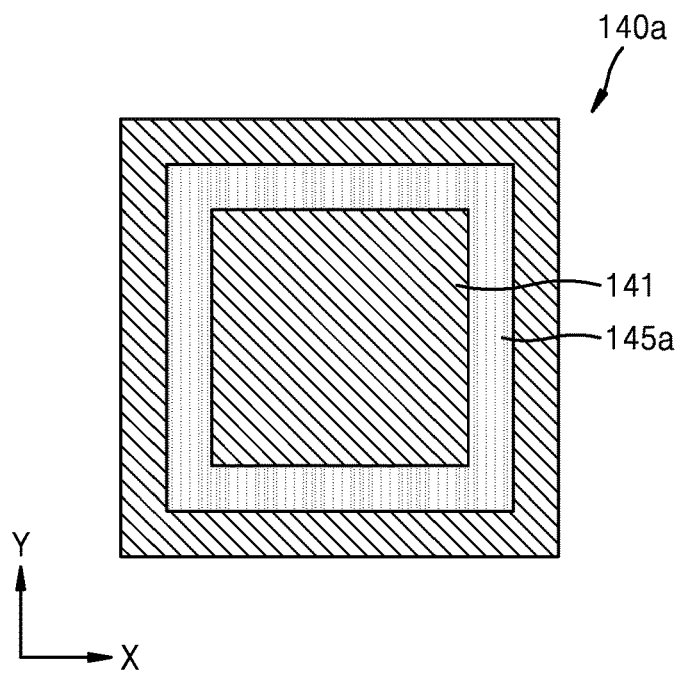

FIGS. 8A and 8B are cross-sectional views for explaining a stack boat tool 100a according to some embodiments of the inventive concept. FIG. 8A is a cross-sectional view of the stack boat tool 100a according to the some embodiments. FIG. 8B is a plan view of an upper surface of a base 141 of a weight bar 140a of FIG. 8A.

The stack boat tool 100a of FIGS. 8A and 8B generally has the same structure as the stack boat tool 100 described with reference to FIGS. 1 through 3 except for the structure of balance weights 145a of the weight bar 140a. In FIGS. 8A and 8B, like reference numerals are used to indicate elements that are substantially identical to the elements of FIGS. 1 through 3, and thus, the detailed descriptions thereof will be omitted or briefly described.

Referring to FIGS. 8A and 8B, the weight bar 140a is arranged on an upper surface of the base 141 and includes the balance weights 145a for lowering the weight center of the weight bar 140a. The balance weights 145a may be arranged on edge portions of the upper surface of the base 141. The balance weights 145a may be symmetrically disposed with respect to the center of the base 141.

The balance weights 145a are arranged on the edge portions of the upper surface of the base 141, and thus, may partly increase a weight applied to edge portions of the stack structure 10. The partly increased weight on the edge portions of the stack structure 10 may further solidly combine edge portions of the upper semiconductor package 13 and edge portions of the lower semiconductor package 11 that are connected by the connection members 15. Also, since the weight is partly increased on the edge portions of the stack structure 10, the connection members 15 arranged on edge portions of a lower surface of the upper semiconductor package 13 may be formed to have a further uniform height.

In some embodiments, the balance weights 145a may have a shape extending along edges of the base 141 on the edge portions of the upper surface of the base 141. For example, as depicted in FIG. 8B, the balance weights 145a may continuously extend along the edges of the upper surface of the base 141. Also, unlike the diagram of FIG. 8B, the balance weights 145a may discontinuously extend along the edges of the upper surface of the base 141.

Figure 9:
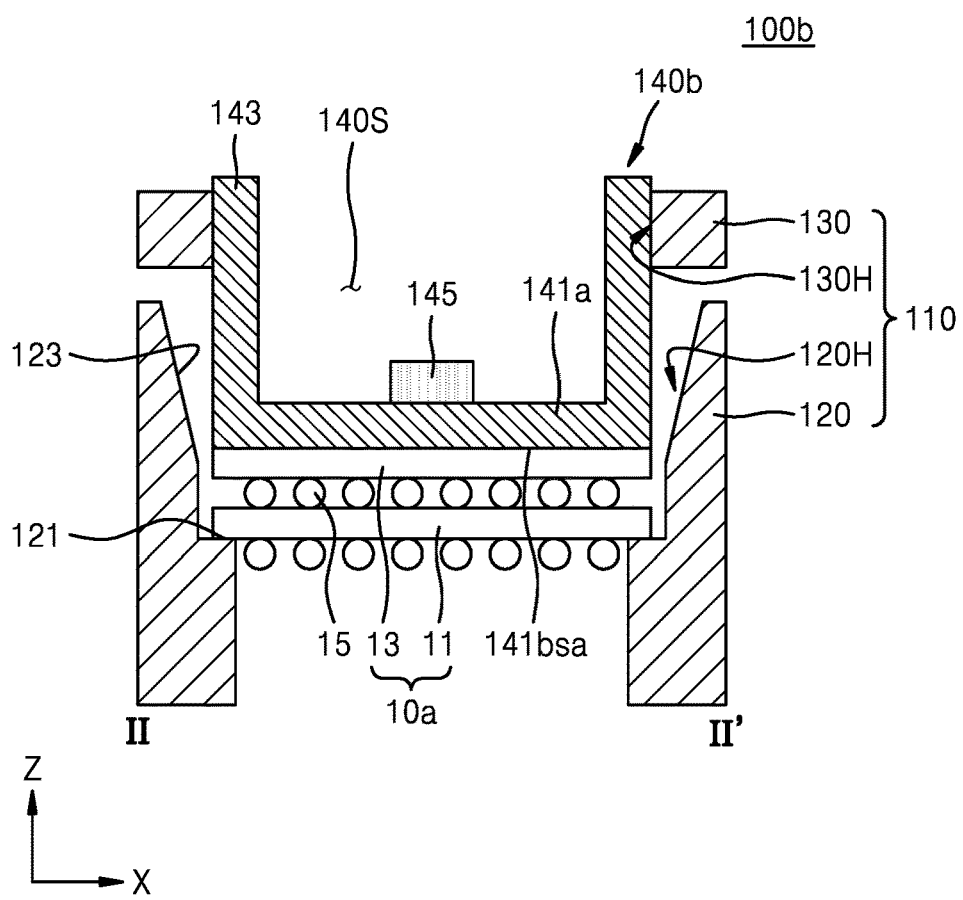
FIG. 9 is a cross-sectional view for explaining a stack boat tool according to some embodiments of the inventive concept.

FIG. 9 is a cross-sectional view for explaining a stack boat tool 100b according to some embodiments of the inventive concept.

The stack boat tool 100b of FIG. 9 generally has the same structure as the stack boat tool 100 described with reference to FIGS. 1 through 3 except for the structure of a base 141a of a weight bar 140b. In FIG. 9, like reference numerals are used to indicate elements that are substantially identical to the elements of FIGS. 1 through 3, and thus, the detailed descriptions thereof will be omitted or briefly described.

Referring to FIG. 9, a bottom surface 141bsa of a base 141a facing an upper surface of the upper semiconductor package 13 may have a flat shape. For example, the base 141a may be placed on a stack structure 10a so that the bottom surface 141bsa of the base 141a is in contact with the upper semiconductor package 13. It will be understood that when an element is referred to as being "contacting" or "in contact with" another element, there are no intervening elements present.

Since the bottom surface 141bsa of the base 141a has a flat shape, the weight bar 140b may apply a further uniform pressure to the entire stack structure 10a. When a plurality of connection members 15 are arranged on an entire lower surface of the upper semiconductor package 13, the weight bar 140b having the bottom surface 141bsa, which is flat, may apply further uniform pressure to each of the connection members 15, and thus, the connection members 15 may have a further uniform height.

Figure 10A:
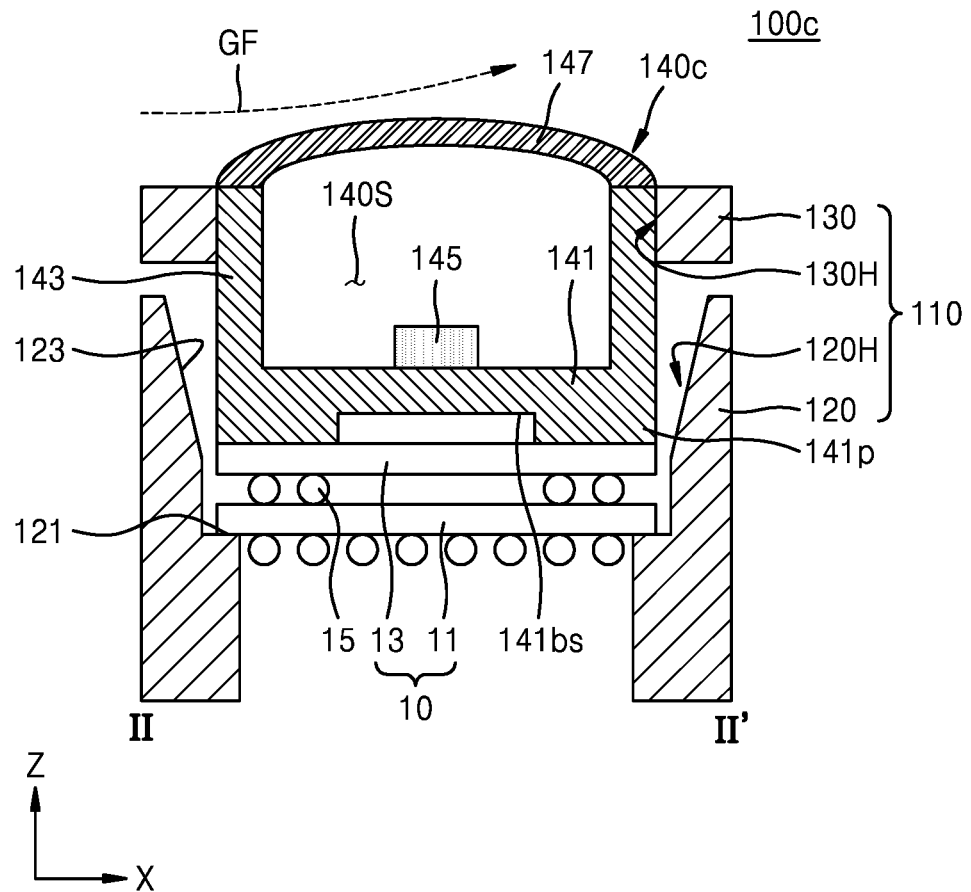
FIGS. 10A and 10B are diagrams for explaining a stack boat tool according to some embodiments of the inventive concept.
Figure 10B:
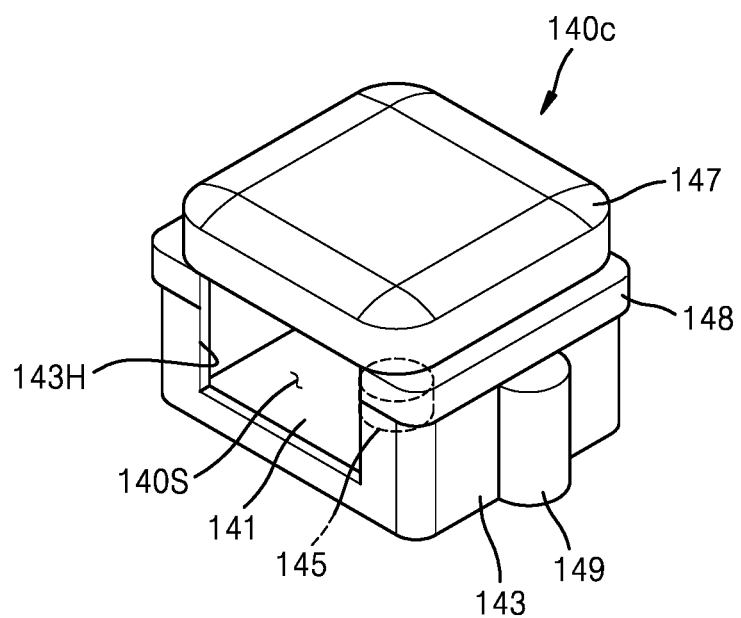

FIGS. 10A and 10B are diagrams for explaining a stack boat tool 100c according to some embodiments of the inventive concept. FIG. 10A is a cross-sectional view of the stack boat tool 100c according to some embodiments of the inventive concept. FIG. 10B is a perspective view of a weight bar 140c of FIGS. 10A and 10B.

The stack boat tool 100c of FIGS. 10A and 10B generally has the same structure as the stack boat tool 100 described with reference to FIGS. 1 through 3 except that the weight bar 140c further includes a ceiling portion 147. In FIGS. 10A and 10B, like reference numerals are used to indicate elements that are substantially identical to the elements of FIGS. 1 through 3, and thus, the detailed descriptions thereof will be omitted or briefly described.

Referring to FIGS. 10A and 10B, the weight bar 140c may include the ceiling portion 147 on the sidewall 143. The ceiling portion 147 may cover an inner space 140S defined by the base 141 and the sidewall 143. When the weight bar 140c is accommodated in the through hole 130H of the upper boat 130, the ceiling portion 147 may protrude from the upper boat 130 in a vertical direction (z-direction). For example, the ceiling portion 147 may prevent a high temperature gas that flows through an upper side of the upper boat 130 from entering into the inner space 140S of the weight bar 140c. Accordingly, vibration or shaking of the weight bar 140c due to the flow of the high temperature gas in the inner space 140S of the weight bar 140c may be reduced.

The ceiling portion 147 may have a shape configured to reduce a resistance against a flow GF of high temperature gas. In some embodiments, the ceiling portion 147 may have a convex shape. In some embodiments, the ceiling portion 147 may have a streamline shape or a water drop shape.

Figure 11:
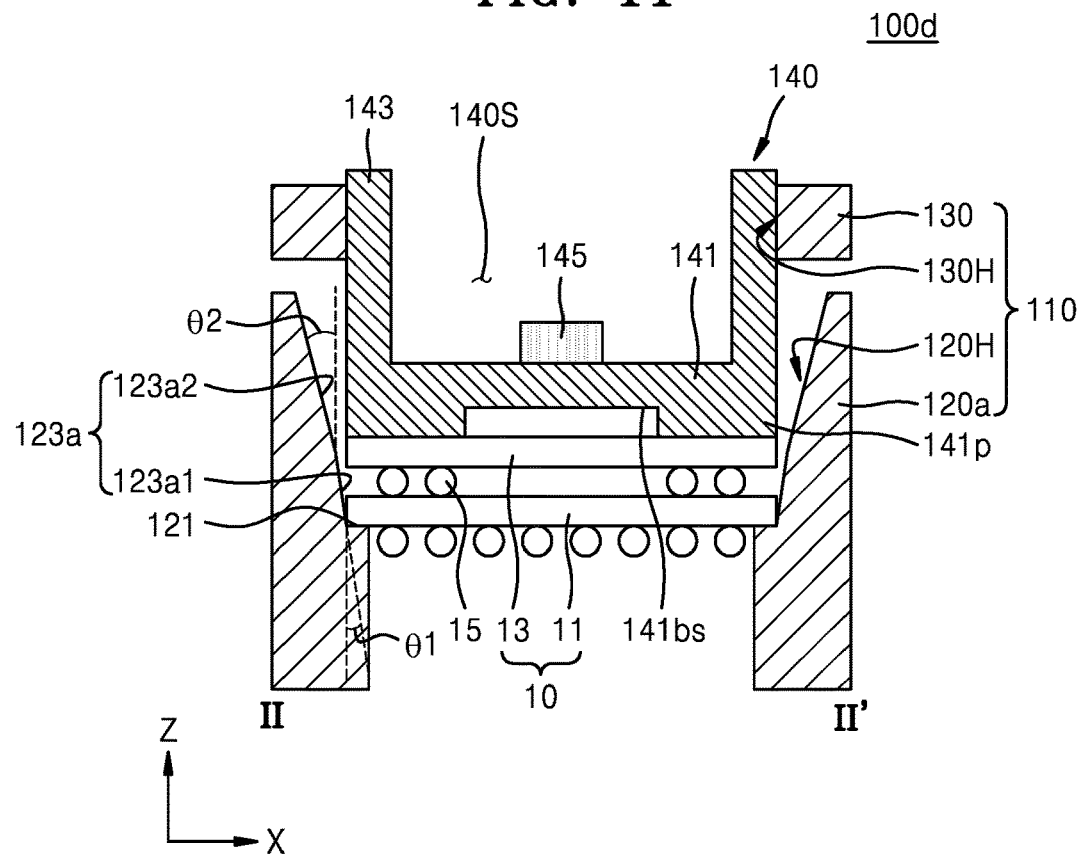
FIG. 11 is a cross-sectional view for explaining a stack boat tool according to some embodiments of the inventive concept.

FIG. 11 is a cross-sectional view for explaining a stack boat tool 100d according to some embodiments of the inventive concept.

The stack boat tool 100d of FIG. 11 generally has the same structure as the stack boat tool 100 described with reference to FIGS. 1 through 3 except for an inner surface of a lower boat 120a. In FIG. 11, like reference numerals are used to indicate elements that are substantially identical to the elements of FIGS. 1 through 3, and thus, the detailed descriptions thereof will be omitted or briefly described.

Referring to FIG. 11, the lower boat 120a may include a supporting surface 121 and an inclined surface 123a that are provided by the stack hole 120H. The inclined surface 123a may extend from the supporting surface 121 upwards in the stack hole 120H. Since the inclined surface 123a is formed close to the supporting surface 121, a seating failure, that is, a derailing of the lower semiconductor package 11 and/or the upper semiconductor package 13 from a predetermined position or the seating of the lower semiconductor package 11 and/or the upper semiconductor package 13 on the supporting surface 121 with a non-horizontal state may be prevented.

In some embodiments, an inclination angle of the inclined surface 123a with respect to a vertical direction to the supporting surface 121 may vary according to the position of the vertical direction of the inclined surface 123a. For example, the inclination angle of the inclined surface 123a with respect to the vertical direction to the supporting surface 121 may gradually increase away from the supporting surface 121 in the vertical direction (for example, a z-direction).

For example, the inclined surface 123a may include a first inclined surface 123a1 extending upwards in the stack hole 120H from the supporting surface 121 and a second inclined surface 123a2 extending upwards in the stack hole 120H from the first inclined surface 123a1. A first inclination angle θ1 of the first inclined surface 123a1 inclined with respect to a first direction which is vertical to the supporting surface 121 may be smaller than a second angle θ2 of the second inclined surface 123a2 inclined with respect to the first direction. For example, the first angle θ1 may be in a range of about 3° to about 8°, and the second angle θ2 may be in a range of about 30° to about 40°.

The first inclined surface 123a1 may be a surface near the supporting surface 121, and may face at least portions of side surfaces of the lower semiconductor package 11 and the upper semiconductor package 13 accommodated in the stack hole 120H. The lower semiconductor package 11 is lowered by being guided by the first inclined surface 123a1 until the lower semiconductor package 11 is seated on the supporting surface 121, and thus, the lower semiconductor package 11 may be correctly seated on a predetermined position. Thus, the seating of the lower semiconductor package 11 on the supporting surface 121 with a non-horizontal state may be prevented. Also, since the lower semiconductor package 11 is seated in a horizontal state, a seating failure of the upper semiconductor package 13 resulting from the seating failure of the lower semiconductor package 11 may be prevented. Accordingly, a non-wet defect or a short defect that may occur as a result of seating failure in a reflow process may be prevented.

Figure 12:
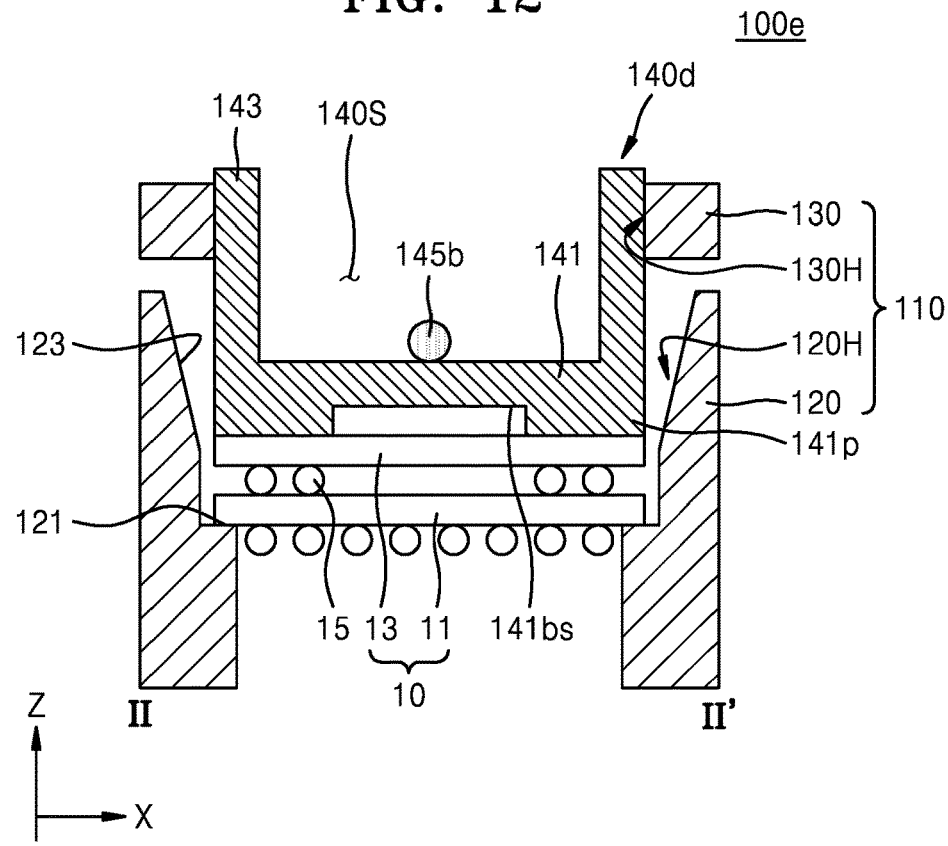
FIG. 12 is a cross-sectional view for explaining a stack boat tool according to some embodiments of the inventive concept.

FIG. 12 is a cross-sectional view for explaining a stack boat tool 100e according to some embodiments of the inventive concept.

The stack boat tool 100e depicted in FIG. 12 may have generally the same configuration as the stack boat tool 100 described with reference to the FIGS. 1 through 3 except that the structure of a balance weight 145b. In FIG. 12, like reference numerals are used to indicate elements that are identical to the elements of FIGS. 1 through 3, and thus, the detailed descriptions thereof will be omitted or briefly described.

Referring to FIG. 12, a weight bar 140d may include the balance weight 145b having a ball shape. For example, a vertical cross-section of the balance weight 145b may include a circular shape or an oval shape.

A single balance weight 145b may be arranged on an upper surface of the base 141, but the number of the balance weight 145b is not limited thereto. For example, a plural number of balance weights 145b may be arranged on the upper surface of the base 141. Also, the balance weight 145b may be arranged on a center region of the upper surface of the base 141, but the location of the balance weight 145b is not limited thereto. For example, a plurality of the balance weights 145b may be arranged on edge parts of the upper surface of the base 141. In this case, the plurality of the balance weights 145b may be symmetrically arranged with respect to the center of the upper surface of the base 141.

For example, since the balance weight 145b has a ball shape, a resistance between the balance weight 145b and a high temperature gas entered into the inner space 140S of the weight bar 140d may be reduced. Therefore, a vibration or shaking of the weight bar 140d due to a flow of the high temperature gas entered into the inner space 140S of the weight bar 140d may be reduced.

Figure 13A:
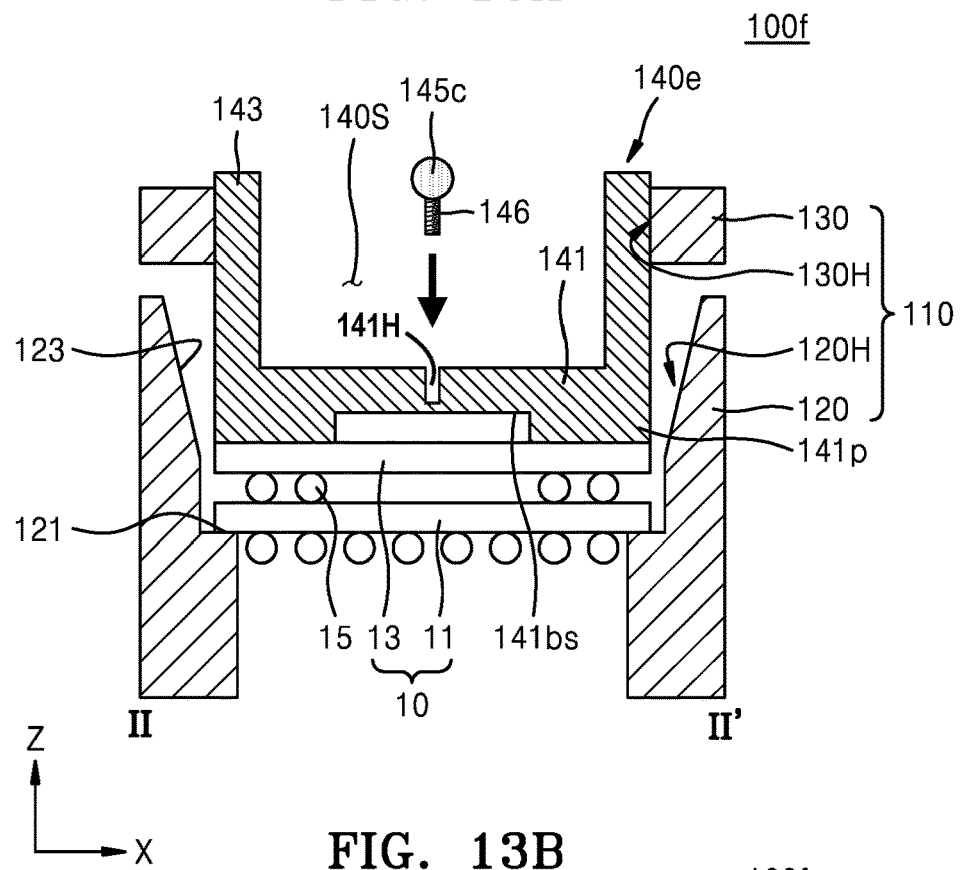
FIGS. 13A and 13B are cross-sectional views for explaining a stack boat tool according to some embodiments of the inventive concept.
Figure 13B:
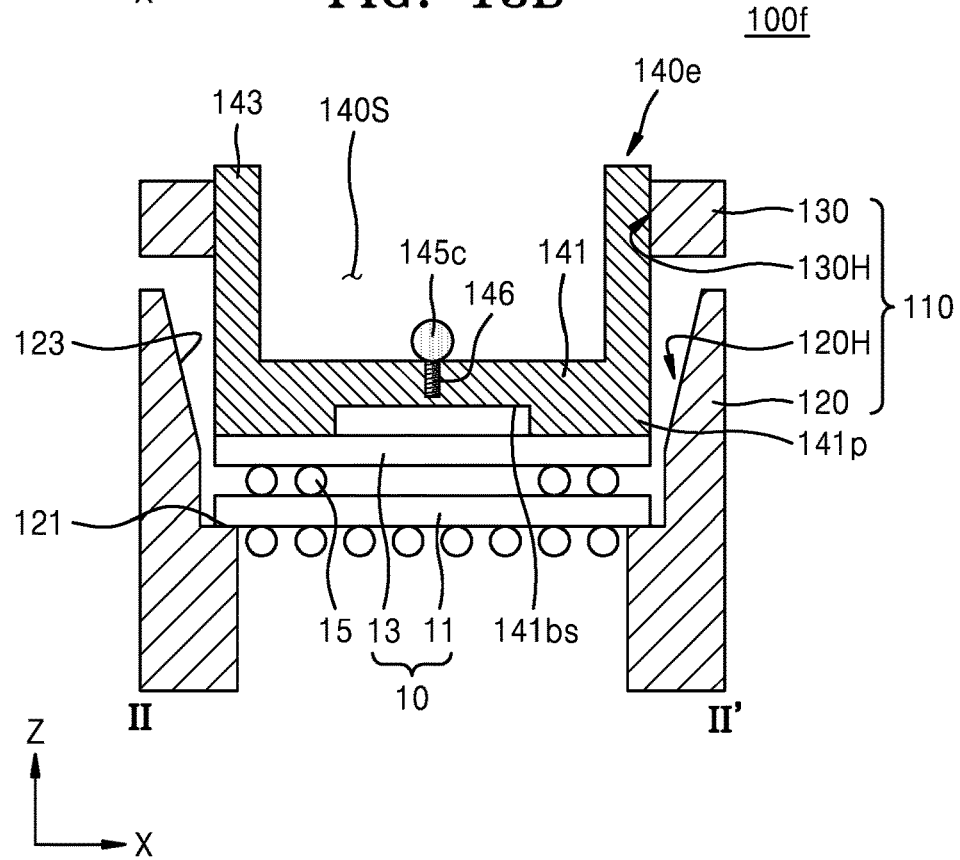

FIGS. 13A and 13B are cross-sectional views for explaining a stack boat tool 100f according to some embodiments of the inventive concept. FIG. 13A shows a state in which a balance weight 145c is separated from the base 141, and FIG. 13B shows a state in which the balance weight 145c is coupled with the base 141.

Referring to FIGS. 13A and 13B, a weight bar 140e may include the balance weight 145c detachably coupled with the base 141. In some embodiments, a coupling hole 141H may be provided in the base 141 and the balance weight 145c may include a coupling screw 146 configured to be accommodated in the coupling hole 141H. As the coupling screw 146 is accommodated in the coupling hole 141H, the balance weight 145c may be coupled to the base 141.

In some embodiments, a weight of the weight bar 140e may be controlled by the balance weight 145c. For example, the weight of the weight bar 140e may be increased by coupling the balance weight 145c with the base 141, and the weight of the weight bar 140e may be reduced by separating the balance weight 145c from the base 141. Since the weight of the weight bar 140e is controlled according to whether the balance weight 145c is coupled with or uncoupled from the base 141, a weight to be applied to the stack structure 10 may be controlled.

In some embodiments, the balance weight 145c may function as an auxiliary weight for additionally controlling the weight of the weight bar 140e. For example, the weight bar 140d may include the auxiliary weight configured to be detachably coupled with the base 141 together with a fixed balance weight (for example, the balance weight 145 of FIG. 2) fixed on the base 141. The weight bar 140e may include at least one auxiliary weight.

Figure 14:
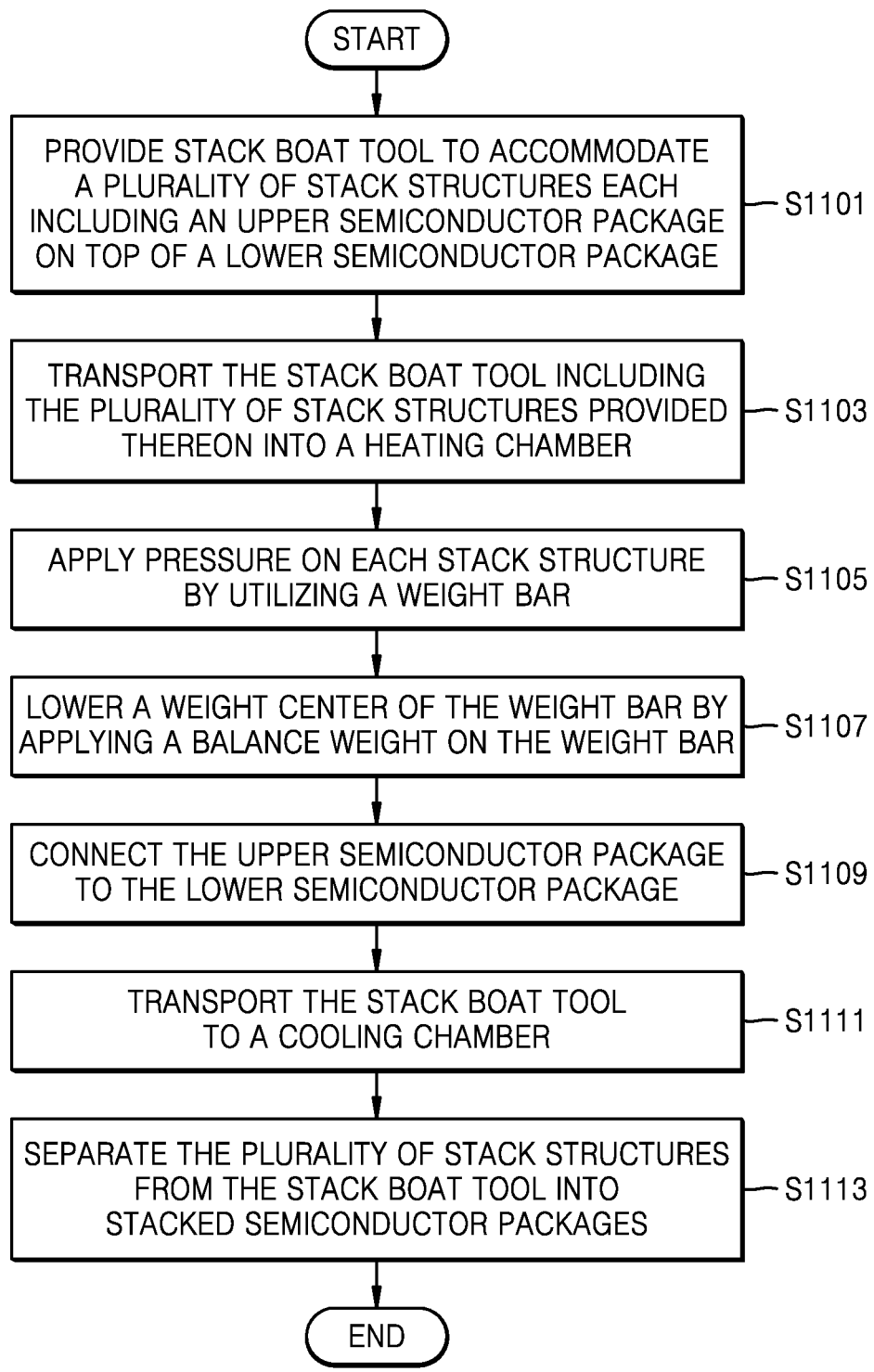
FIG. 14 is a flow chart showing a method of manufacturing a semiconductor device including performing a reflow process according to exemplary embodiments of the present disclosure.

FIG. 14 is flow chart showing a method of manufacturing a semiconductor device, including performing a reflow process using a stack boat tool according to exemplary embodiments of the present disclosure, and more particularly, a method of manufacturing a semiconductor package using a stack boat tool according to exemplary embodiments of the present disclosure.

In step S1101, a stack boat tool is provided. The stack boat tool may be a stack boat tool 100, 100a, 100b, 100c, or 100d according to the exemplary embodiments as disclosed above. The stack boat tool 100, 100a, 100b, 100c, 100d, 100e, or 100f is configured to accommodate a plurality of stack structures each including an upper semiconductor package provided on top of a lower semiconductor package. Each stack structure may be a stack structure 10, 10_1, 10_2, or 10a according to the exemplary embodiments as disclosed above. The upper semiconductor package may be an upper semiconductor package 13 or 13' and the lower semiconductor package may be a lower semiconductor package 11 or 11' according to the exemplary embodiments as disclosed above.

In step S1103, the stack boat tool including the plurality of stack structures provided thereon is transported to a heating chamber (not shown). The stack boat tool may include a boat 110 and a weight bar 140, 140_1, 140_2, 140a, 140b, 140c, 140d, or 140e according to the exemplary embodiments as disclosed above. The boat 110 may include a lower boat 120 or 120a and an upper boat 130 according to the exemplary embodiments as disclosed above.

In step S1105, pressure is applied on each stack structure 10, 10_1, 10_2, or 10a by utilizing the weight bar 140, 140_1, 140_2, 140a, 140b, 140c, 140d, or 140e. The upper boat 130 may include a through hole 130H configured to accommodate the weight bar 140. The upper boat 130 may be arranged on the lower boat 120 or 120a, and may be coupled to the lower boat 120 or 120a so that the through hole 130H is vertically aligned with a stack hole 120H of the lower boat 120. The weight bar 140 is accommodated in the through hole 130H of the upper boat 130. The weight bar 140, 140_1, 140_2, 140a, 140b, 140c, 140d, or 140e is a structure having a sufficient weight configured to apply pressure to the stack structure 10, 10_1, 10_2, or 10a by being placed on the stack structure 10, 10_1, 10_2, or 10a placed in the stack hole 120H of the lower boat 120. For example, the weight bar 140, 140_1, 140_2, 140a, 140b, 140c, 140d, or 140e may apply a weight corresponding to the weight thereof to the stack structure 10, 10_1, 10_2, or 10a while a reflow process is being performed.

In step S1107, a weight center of the weight bar 140, 140_1, 140_2, 140a, 140b, 140c, 140d, or 140e is lowered by applying a balance weight on the weight bar. The balance weight may be a balance weight 145, 145a, 145b, or 145c according to the exemplary embodiments disclosed above. The balance weight may be arranged on an upper surface of a base of the weight bar. In some embodiments, the balance weight may be arranged on a center of the upper surface of the base of the weight bar. In some embodiments, a pair of balance weights may be arranged on opposing edge portions of the weight bar. In some embodiments, the balance weight may have a weight in a range from about 10% to about 30% of a total weight of the weight bar, but the weight of the balance weight is not limited thereto. In some embodiments, the balance weight may include a material having a specific weight greater than other parts of the weight bar.

In step S1109, the upper semiconductor package 13, 13' is connected to the lower semiconductor package 11, 11'. Due to the weight applied by the weight bar 140, 140_1, 140_2, 140a, 140b, 140c, 140d, or 140e, the lower semiconductor package 11, 11' and/or the upper semiconductor package 13, 13' may be stably connected to each other by the connection members 15 provided on a lower surface of the upper semiconductor package 13, 13'. In some embodiments, a uniform weight may be applied to the stack structure 10, 10_1, 10_2, or 10a in which the lower semiconductor package 11, 11' and the upper semiconductor package 13, 13' are vertically stacked by using the weight bar 140, 140_1, 140_2, 140a, 140b, 140c, 140d, or 140e that is accommodated to be able to float in the through hole 130H of the upper boat 130. Therefore, the occurrence of a non-wet defect or a short defect due to thermal deformation of the lower semiconductor package 11 and the upper semiconductor package 13 may be prevented.

Also, the weight bar 140, 140_1, 140_2, 140a, 140b, 140c, 140d, or 140e included in the stack boat tool 100, 100a, 100b, 100c, 100d, 100e, or 100f includes the balance weight 145, 145a, 145b, or 145c for lowering the weight center of the weight bar 140, 140_1, 140_2, 140a, 140b, 140c, 140d, or 140e and thus, vibration or shaking of the weight bar 140, 140_1, 140_2, 140a, 140b, 140c, 140d, or 140e due to the flow of high temperature gas in the heating chamber may be mitigated, and an excessive variation of weight applied to the stack structure 10, 10_1, 10_2, or 10a may be prevented.

In step S1111, the stack boat tool 100, 100a, 100b, 100c, 100d, 100e, or 100f is transported to a cooling chamber.

In step S1113, after cooling, the plurality of stack structures are separated from the stack boat tool 100, 100a, 100b, 100c, 100d, 100e, or 100f into stacked semiconductor packages.

While the embodiments of have been described in detail with reference to accompanying drawings. In the specification, specific terminologies have been used to describe the embodiments. However, it should be understood that embodiments described herein should be considered in a descriptive sense only and not for purposes of limitation. Also, it should be understood that the inventive concept is not limited to the embodiments described above because various changes in form and details may be made by those of ordinary skill in the art. Therefore, the scope of the invention is defined not by the detailed description of the invention but by the appended claims.

What is claimed is:

1. A stack boat tool comprising:
   a boat comprising a stack hole, the stack hole configured to accommodate a first semiconductor package and a second semiconductor package on the first semiconductor package; and
   a weight bar configured to be provided on the second semiconductor package during a reflow process for connecting the first and second semiconductor packages,
   wherein the weight bar comprises:
   a base configured to contact an upper surface of the second semiconductor package;
   a sidewall on the base, the sidewall comprising at least one hole; and
   a balance weight on the base configured to lower a weight center of the weight bar.

2. The stack boat tool of claim 1,
   wherein the balance weight is configured to be provided on a center of an upper surface of the base.

3. The stack boat tool of claim 1,
   wherein the balance weight has a shape extending along edges of an upper surface of the base.

4. The stack boat tool of claim 1,
   wherein the weight bar comprises a ceiling portion on the sidewall.

5. The stack boat tool of claim 4,
   wherein the ceiling portion has a streamline shape.

6. The stack boat tool of claim 1,
   wherein the base comprises a protrusion part protruding from a bottom surface of the base at edge portions of the bottom surface of the base facing the upper surface of the second semiconductor package.

7. The stack boat tool of claim 1,
   wherein the base comprises a flat bottom surface.

8. The stack boat tool of claim 1, wherein the boat comprises:
a lower boat comprising the stack hole; and
an upper boat removably coupled to the lower boat and comprising a through hole configured to accommodate the weight bar,
wherein the upper boat is coupled to the lower boat in a manner such that the through hole is aligned with the stack hole of the lower boat.

9. The stack boat tool of claim 8, wherein the weight bar is accommodated in the through hole, the weight bar configured to float within a predetermined range in a vertical direction.

10. The stack boat tool of claim 9, wherein
the upper boat comprises guide grooves in an inner surface of the through hole to guide the weight bar in the vertical direction, and
the weight bar comprises guide protrusions extending in the vertical direction on the sidewall corresponding to the guide grooves.

11. The stack boat tool of claim 8, wherein the lower boat comprises:
a supporting surface configured to support the first semiconductor package;
a first inclined surface that extends from the supporting surface and is inclined with a first angle with respect to a first direction which is a vertical direction to the supporting surface, and
a second inclined surface that extends from the first inclined surface and is inclined with a second angle with respect to the first direction,
wherein the second angle is greater than the first angle.

12. A stack boat tool comprising:
a lower boat comprising a stack hole configured to accommodate a first semiconductor package and a second semiconductor package on the first semiconductor package;
an upper boat configured to be removably coupled to the lower boat, wherein the upper boat comprises a through hole configured to be vertically arranged with the stack hole; and
a weight bar configured to be provided on the second semiconductor package, wherein the weight bar is configured to be accommodated in the through hole, wherein the weight bar comprises:
a base facing an upper surface of the second semiconductor package;
a sidewall that is arranged on the base and defines an inner space together with the base; and
a ceiling portion that is arranged on the sidewall and covers the inner space.

13. The stack boat tool of claim 12, wherein the weight bar further comprises a balance weight on the base configured to lower a weight center of the weight bar.

14. The stack boat tool of claim 12, wherein the sidewall of the weight bar comprises at least one hole configured to connect an inner space of the weight bar to the outside of the weight bar.

15. The stack boat tool of claim 12, wherein
the upper boat comprises an upper stopper and a lower stopper on an inner surface provided by the through hole, the upper stopper and the lower stopper being spaced apart from each other in a vertical direction,
the weight bar comprises a stop bumper that protrudes from the sidewall and is configured to contact the upper stopper and the lower stopper.

16. A stack boat tool comprising:
a lower boat comprising at least one stack hole configured to accommodate a stack structure comprising first and second semiconductor packages vertically stacked thereon;
an upper boat that comprises at least one through hole and is removably attached to the lower boat in a manner such that the at least one through hole is aligned with the at least one stack hole; and
a weight bar configured to be accommodated in the at least one through hole, the weight bar configured to float in the at least one through hole and to apply a weight to the stack structure.

17. The stack boat tool of claim 16, wherein the weight bar comprises:
a base configured to contact the stack structure;
a sidewall on the base; and
a balance weight on the base.

18. The stack boat tool of claim 17, wherein the weight bar further comprises a ceiling portion having a convex shape on the sidewall.

19. The stack boat tool of claim 17, wherein the balance weight is detachably coupled to the base.

* * * * *